United States Patent [19]

Jones et al.

[11] Patent Number: 5,578,139
[45] Date of Patent: Nov. 26, 1996

[54] STOWABLE AND DEPLOYABLE SOLAR ENERGY CONCENTRATOR WITH FRESNEL LENSES

[75] Inventors: P. Alan Jones, Santa Barbara; T. Jeffrey Harvey, Lompoc; Allister F. Fraser; David M. Murphy, both of Santa Barbara, all of Calif.

[73] Assignee: AEC-Able Engineering Co., Inc., Goleta, Calif.

[21] Appl. No.: 368,774

[22] Filed: Jan. 3, 1995

[51] Int. Cl.$^6$ ............... H01L 31/045; H01L 31/052
[52] U.S. Cl. ............... 136/245; 136/246; 136/292
[58] Field of Search ............... 136/245, 246, 136/292

[56] References Cited

U.S. PATENT DOCUMENTS 5,296,044  3/1994  Harvey et al. ............... 136/245

FOREIGN PATENT DOCUMENTS 61-199671  9/1986  Japan ............... 136/245
61-202479  9/1986  Japan ............... 136/245

Primary Examiner—Aaron Weisstuch
Attorney, Agent, or Firm—Donald D. Mon

[57] ABSTRACT

A stowable and deployable concentrator for solar cells. A substrate mounts a row of solar cells. A row of Fresnel lens elements is mounted to the substrate so as to be deflectable toward the substrate in a stowed configuration and biased away from it in the deployed configuration. The Fresnel lens is linear and flexibly mounted in a shaper which shapes it to a proper curvature in the deployed configuration. A pair of these concentrators can be hinged together to form a conveniently stowed and readily deployed combination.

7 Claims, 3 Drawing Sheets

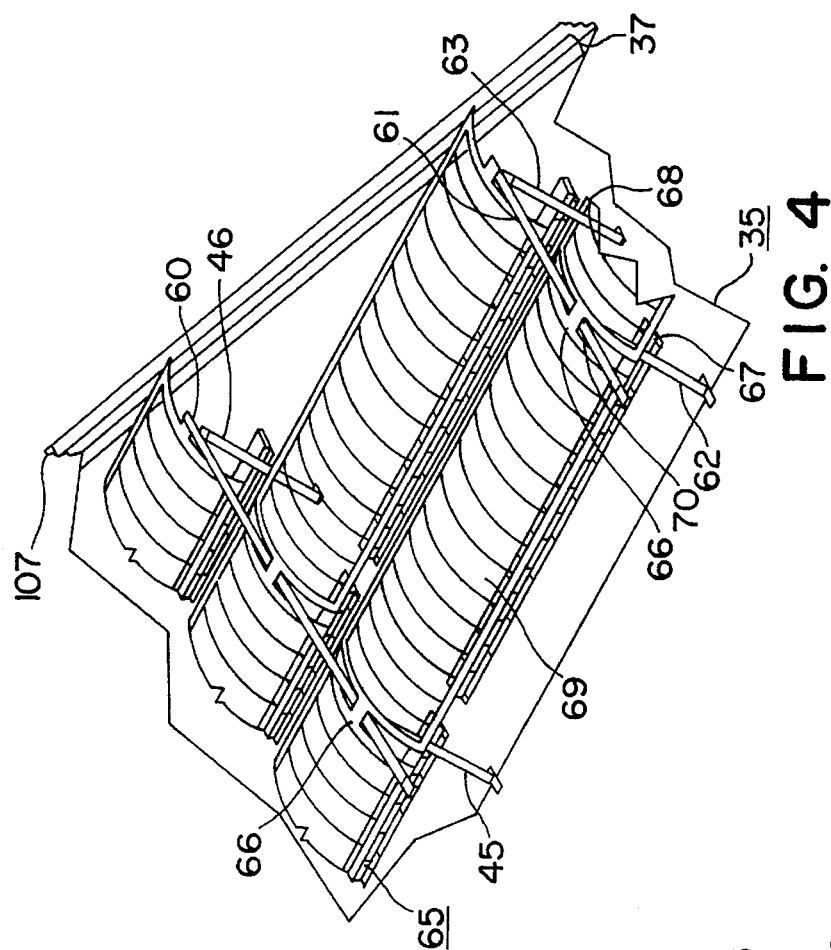
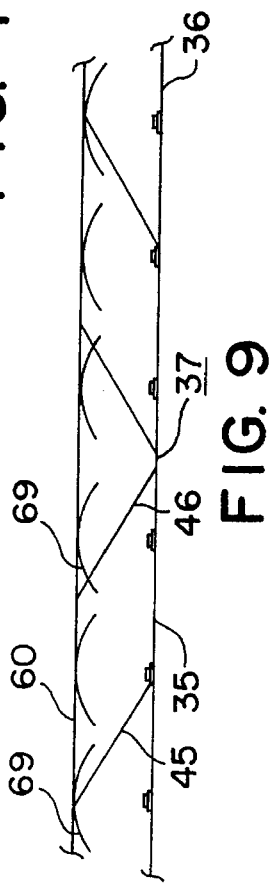
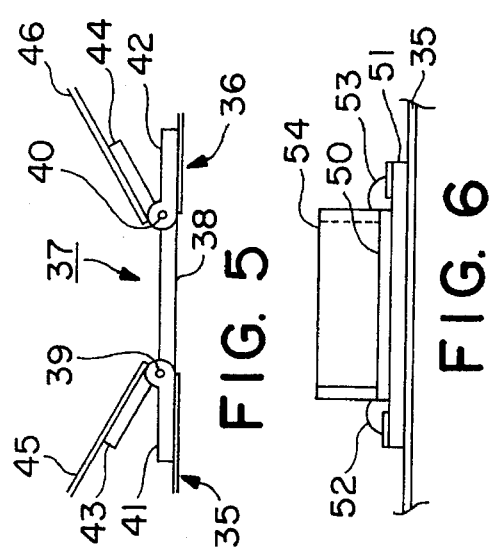
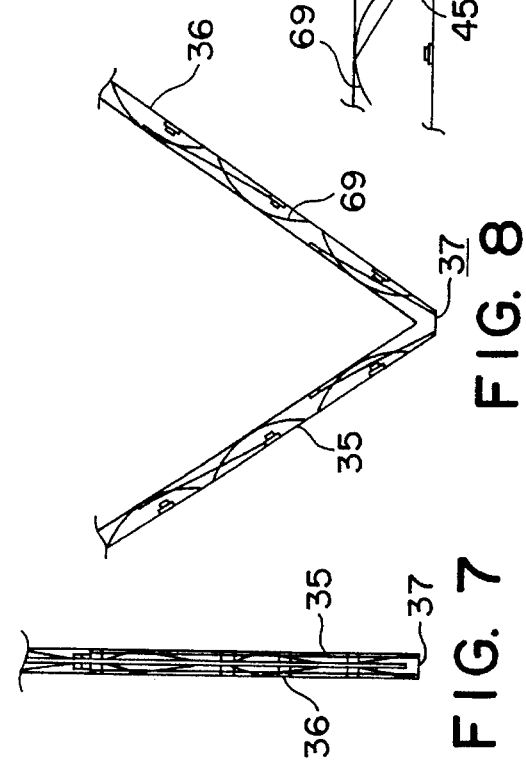

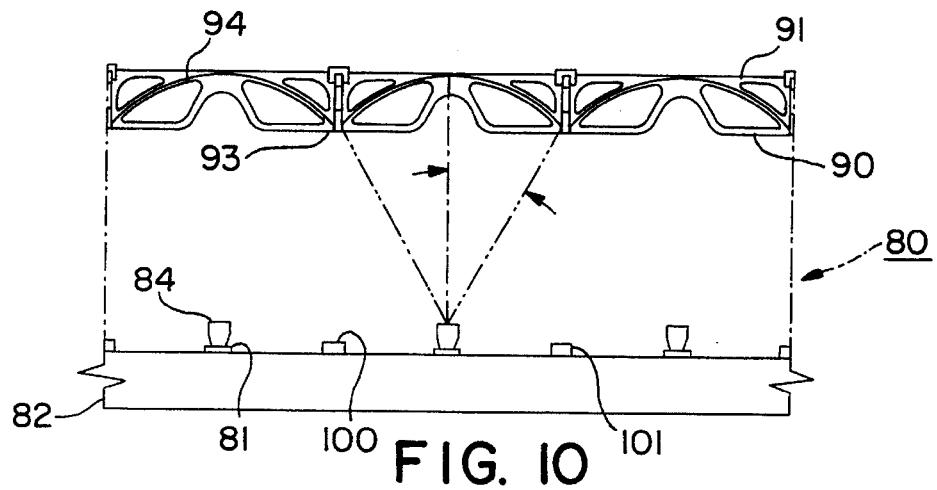
FIG. 10
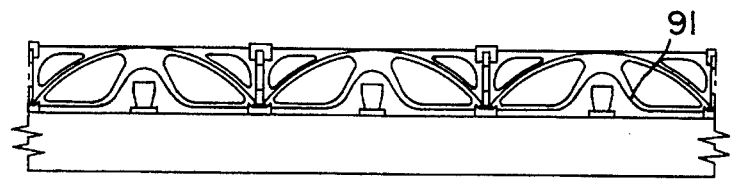
FIG. 11
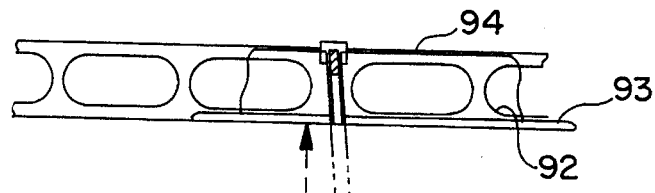
FIG. 12
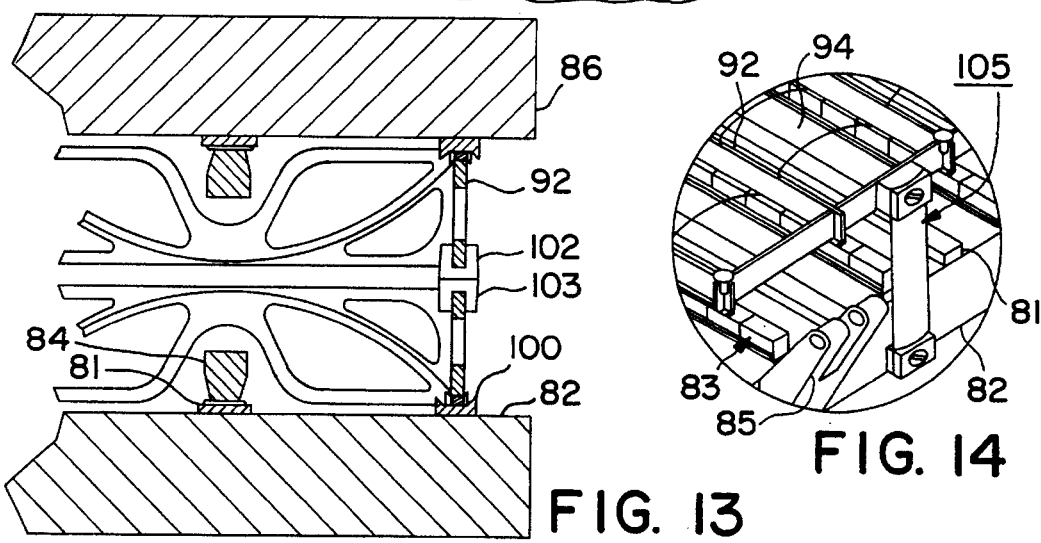
FIG. 13
FIG. 14

STOWABLE AND DEPLOYABLE SOLAR ENERGY CONCENTRATOR WITH FRESNEL LENSES

FIELD OF THE INVENTION

A concentrator for solar energy which focuses incident energy on a lesser cell area, which can be stowed in a lesser volume and envelope dimensions than its deployed volume and envelope dimensions, and which can readily be deployed to its deployed operative configuration from its stowed configuration, with its families of cells and Fresnel lenses in closely-defined relationships to one another.

BACKGROUND OF THE INVENTION

Solar cells which convert radiant energy from the sun into electrical energy are used to power spacecraft. Designers of power systems for this application face numerous design constraints of which weight is one of the most critical. The extraordinarily high cost of placing a pound of weight into space is a serious constraint, and any improvement which can reduce the weight and still provide adequate performance is actively sought.

Another constraint is the need for shielding the solar cells against radiation in regions of high fluence. An example is found in Van Allen belt radiation at about 7,000 kilometers elevation, which is where many satellites orbit. It is not uncommon to apply a shielding layer of sufficient density over an entire craft merely in order to protect some parts of if, especially the solar cells. This significantly increases the weight of the craft. Any arrangement which can reduce the area or volume that must be shielded is also actively sought.

Still another constraint Is the large cost of the solar cells. These cells often are as much as 60% of the cost of the entire solar array. Reduction of required cell area, while still obtaining the same power output, is another sought-after advantage.

Yet another constraint is the volume required to pack a solar cell array into a spacecraft for containment while being launched. Reduction of stowed envelope volume is another design objective.

This invention provides an improvement for all of the above design constraints and objectives. It requires a lesser area of cells for the same net incident sunlight area, and provides a configuration stowable in a lesser volume that is readily deployable to a larger volume in which its elements are properly arranged relative to one another. The consequence is a significant reduction of weight for the same kilowatt output, especially for those missions requiring significant shielding thickness. A further consequence is that the reduced area of cells can reduce array costs.

BRIEF DESCRIPTION OF THE INVENTION

A stowable and deployable concentrator for solar cells according to this invention includes a Fresnel lens, which may be circular, but which preferably will be linear. The lens may be flat, but preferably will be trough-like when linear and domed when circular. A frame supports the lens, and the frame in turn is supported by support means which itself is mounted to a base. The lens has a transverse window area, a focus, and a focus area at the focus (or at a secondary lens). Solar cells are mounted to the base in the focus area. The focus area for a circular lens will be spot-like. The focus area for a linear lens will be linear, generally rectangular.

According to a preferred but optional feature of one embodiment of this invention, the lens is linear, trough-like, and flexible. The portion of the frame which defines the proper curvature of the lens is springily flexible, but self-shape retaining, tending to return to its original shape after a distorting force is released. The frame and the lens can be flattened when pressed toward the base, thereby optimally to reduce the volume of the concentrator in its stowed condition.

In another embodiment of the invention, the lenses are held in their bent shape at all times by a rigid frame which is spring-biased away from the base.

In both of the embodiments of this invention, the supporting means mounts the frames in such a manner as to accurately position the cells when the concentrator is deployed. In one embodiment, a spring-loaded pantographic array of rigid link elements is provided. In the other embodiment stiff springs limited to folding in only one plane are provided.

The above and other features of this invention will be fully understood from the following detailed description and the accompanying drawings, in which:

BRIEF DESCRIPTION OF THE DRAWINGS

FIG. 4 is an enlarged perspective view of the module shown in FIG. 3, taken at area 4—4 therein;

FIG. 5 is a side view of a hinge used in FIG. 4;

FIG. 6 is an end view of a strip of solar cells used in FIG. 4;

FIG. 7 is a fragmentary end view in schematic notation of two panels of a module in the stowed configuration;

FIG. 8 is a fragmentary end view in schematic notation of the panels of FIG. 7 in the partially deployed configuration;

FIG. 9 is a fragmentary end view in schematic notation of the panels of FIG. 7 in the deployed configuration;

FIG. 10 is an enlarged end view, as in FIG. 9, showing details of construction of the alternative embodiment in the deployed configuration;

FIG. 11 is a view similar to FIG. 10, showing the stowed configuration;

FIG. 12 is a lateral view showing the planned path of shadows with regard to the underlying receiver cells;

FIG. 13 is a fragmentary cross-section showing two panels brought together in the stowed configuration; and FIG. 14 is a fragmentary perspective view showing details of deployment and support means used in the embodiment of FIGS. 10–14.

DETAILED DESCRIPTION OF THE INVENTION

A photovoltaic module using a trough-like linear Fresnel lens and an in-line array of solar cells is known. No claim is made to this feature of the invention, per se. Its characterizing feature is a curved trough-like lens bearing Fresnel facets. As a consequence, incident energy is deflected (refracted) toward a focal area of lesser area where the cells are placed. The lens is intended to be held by rigid members in its correct location and configuration relative to the cell array. A lens of this type, which can be obtained from Entech, Inc., of Dallas, Tex., is useful in this instant invention.

In addition to linear lenses, conventional domed circular Fresnel lenses can be utilized, but these suffer from the fact that they focus to a spot, and cannot enjoy the benefit of the elongated linear lens and its attendant greater tolerance for optical misalignment. Linear lenses are to be preferred because of their less expensive manufacturing cost and their relatively larger tolerance of misalignment.

Figure 1:
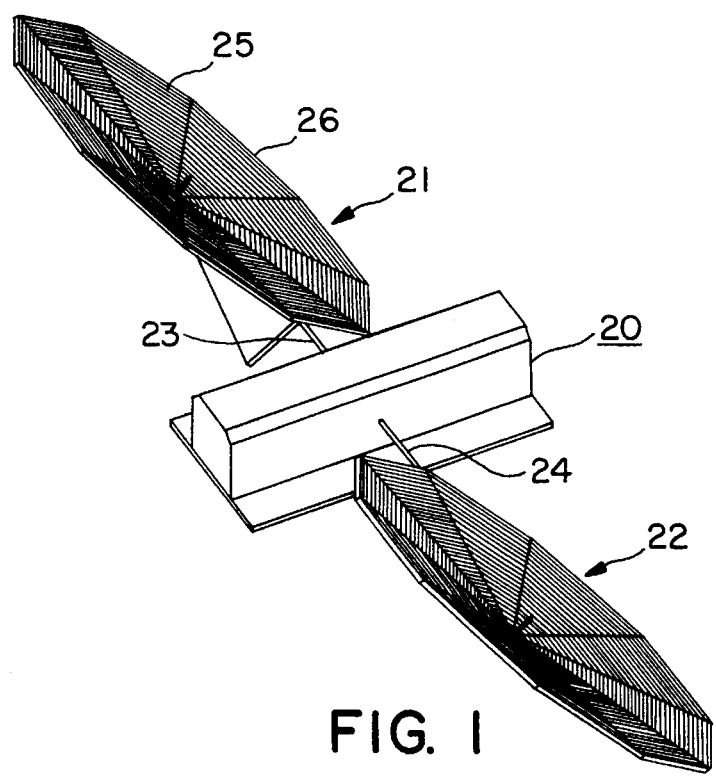
FIG. 1 is a perspective view showing a deployed solar array according to the presently-preferred embodiment of the invention.

FIG. 1 shows the primary structure 20 of a spacecraft or satellite to which two solar arrays 21, 22 according to one embodiment of this invention are mounted by respective standoff booms 23, 24. The arrays are shown deployed, adjacent pairs of segment-shaped gores such as gores 25, 26 having been unfolded relative to one another to provide a polygonal-shaped array that is manipulated to face the sun.

Figure 2:
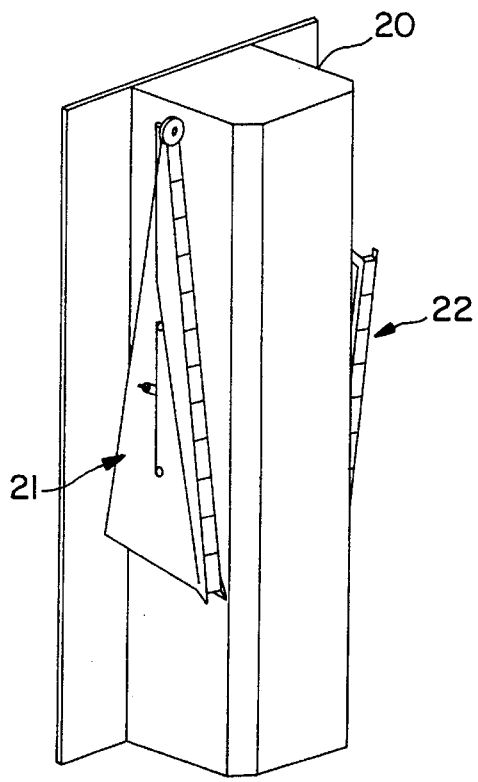
FIG. 2 is a fragmentary perspective view showing the array of FIG. 1 in its stowed configuration.

Before flight, the arrays will have been folded into the triangular-shaped stacked configurations shown in FIG. 2. Adjacent gores, such as gores 25 and 26 will have been folded against each other around hinges to form a compact stowed stack. The arrays will be unlatched and opened by means which are of no importance to this invention.

Figure 3:
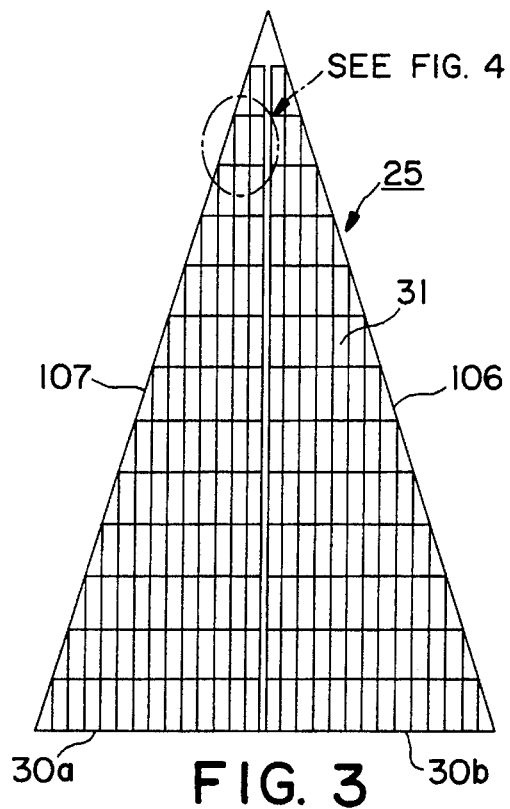
FIG. 3 is a plan view of a deployed module from FIG. 1.

When deployed, as shown in FIG. 3, gore 25 (and all other gores), are formed into a module by two gore halves 30a and 30b adapted to be folded against one another. The long radially-oriented edges of any gore module 25 (or 26) are defined by edge spars 106 and 107. Rows 31 of Fresnel lenses and solar cells will be exposed to solar radiation when the gore is unfolded.

A suitably rigid (or semi-rigid) substrate 35 is shown in FIG. 4 hinged to its edge spar 107 by a hinge 37. All modules will be similar to one another, differing only in their direction of movement relative to the substrates when moving between the two basic configurations (stowed and deployed). Once the assembly is completed, it will be shipped, installed, and launched in its stowed configuration. Then, when it is deployed it is essential that the Fresnel lenses be very accurately aligned with their respective solar cells.

One advantage of the use of Fresnel lenses is that a lesser area of solar cells will be required because of their substantial light concentration power. In fact a concentration ratio of 8:1, with a ±4 degree acceptance angle is attainable. However, it is attainable only if the lenses and the smaller-area solar cells are correctly and always properly oriented relative to one another. This invention accomplishes that objective in both of its embodiments with light weight structures that inherently assume the correct alignment.

As best shown in FIG. 5, hinge 37 between substrates 35 and 36 includes a spacer 38, two spaced apart pivot pins 39, 40, and arms 41, 42 to which the substrates are mounted. Arms 43, 44 mount diagonal struts 45, 46 for a purpose to be discussed. The spacing provided by spacer 38 is required in the stowed configuration to leave room between the substrates for the lenses and cells.

FIG. 6 shows solar cells 80 mounted to a cell base 51, with terminals 52, 53. The base is mounted to the substrate, A cover slide 54 of shielding material overlays the cells to protect them against damaging radiation such as is encountered in orbits commonly used by satellites. Cover slide 54 may alternately be replaced with a set of secondary optics to further concentrate the incident sunlight.

The construction shown in FIGS. 4 and 7–9 illustrates the use of a pantograph (parallelogram) linkage to assure the correct placement of the deployed Fresnel lenses. A plurality of rigid cross-beams 60, 61 (there may and usually will be more than two), are hinged to respective pairs of rigid diagonal struts 45, 46 and 62, 63. In turn, the struts are hinged to the substrate. The lengths of the struts are equal, and their hinge points at the cross beam and on the substrate are equally spaced, thereby forming a parallelogram movement, in which the cross-beams will always be parallel to the substrate.

A lens frame 65 includes shapers 66 and edge runners 67, 68. The shapers are springily flexible, and tend to return to a specific curved shape when distortive forces are released. The edge runners are fixed to the ends of the shapers, and retain the edges of flexible Fresnel optical elements 69. This provides a springy support for the Fresnel elements which shapes them to a correct curvature when the array is deployed.

The cross beams pass through notches 70 in the shapers, and are attached to them as shown. Now it will be seen that the Fresnel elements will always be parallel to the substrate, and that their height above and lateral location relative to the cells will be determined by the angle of the struts relative to the substrate. Since the deployment of the array itself is constrained to position the substrates in a flat, planar position the Fresnel lenses will likewise be in a flat, planar position. The maximum movement of the Fresnel elements away from the substrate is defined and constrained by the finite rigid length of the struts, thereby establishing the correct placement of the lens elements from the cells.

Now notice in FIG. 8, where the module is partially stowed, the runners will have reached the substrate. Thereafter, further folding of the module will cause the shapers and the Fresnel elements partially to flatten. Sufficient side and top clearances are provided so the lenses do not interfere with one another, nor with the cells, as can be seen in FIG. 7, where the module is completely folded. A suitably designed mechanism will be required to automatically coordinate the folding movements of the pantographic structures when the gores are folded together.

The embodiment of FIGS. 1–9 compresses and at least partially flattens the Fresnel lenses when the array is stowed, This is generally tolerable, and when the array is deployed, it is a proper assumption that the lens frames will resume a proper curvature, and that the Fresnel lenses will also return to their properly curved shape as directed by the shaper.

There may be circumstances in which lens distortion will not be agreeable. The embodiment of FIGS. 10–14 provides an arrangement wherein the lens frame and lenses are not distorted. Such an arrangement is better suited for a direct compressive packing movement, rather than for the shear-like movement of a pantographic linkage.

FIG. 10 shows a typical non-distorting module 80 in its deployed condition. Solar cells 81 are mounted to a rigid panel substrate 82 in linear rows 83 (FIG. 14). Optional but desirable secondary lenses 84 extend along the rows. They are mounted to the cells, and further concentrate the solar energy onto the cell surfaces. Suitable circuitry is provided for the cells.

As best shown in FIG. 14, a hinge arm 85 is fixed to the substrate so that the substrates of adjacent modules can be folded and unfolded relative to one another. As best shown in FIG. 13, where substrate 82 and another substrate 86 are brought parallel to one another for stowage purposes, they are spaced apart by this hinge.

Referring to FIGS. 10 and 14, a rigid cell frame 90 is provided with end walls 91 at each end, and rails 92 between them. The end frames have a groove 93 which receives the edges of the Fresnel lenses 94 and defines their curvature, which does not change.

Pads 100, 101 are placed on the substrate between rows of cells, against which the rails will abut when the array is stowed. Spacers 102, 103 are placed on the rails so as to abut one another, also when stowed. As can be seen in FIG. 13, when the substrates are brought to their parallel stowed position, the pads, rails and spacers all abut in a preloaded stack to hold the assembly in a properly aligned relationship.

The compaction of the arrays is independent of its folding action. In the non-distorting embodiment the Fresnel lenses and their frames are mounted to their respective substrates by flexures 105 (FIG. 14). A plurality of these flexures will be provided. These flexures are stiffly flexible tapes preferably made of beryllium-copper about ½" wide and about 0.005" thick. As best shown in FIG. 14, the flexure is linearly bowed so that when it is extended it has a columnar strength which resists sideward shear-like movement of the lens frame in the plane of the flexure, relative to the substrate, in all directions parallel to the substrate. A suitable number of these flexures will be provided, at least one on each side so that shear-like movement is resisted in all lateral directions.

However, the flexures can be manually deformed to be bowed outwardly, bending along their length and near their ends, so the substrates can be brought toward one another. Again it is emphasized that this is a manual task requiring compression of the structures on both modules to the condition shown in FIG. 13. At this time the pads will hold the elements in proper alignment, and the modules can be brought together and latched with a standard restraint mechanism not shown herein. The flexures will be bowed out, and the gores will be held firmly together. The Fresnel lenses will not be distorted.

When the array is to be deployed, the latch will be released and the modules will be pivoted apart, generally under the power of a spring at the hinges. During the deployment, the flexures will gradually straighten out, and finally the Fresnel lens arrays will reach the arrangement shown in FIG. 10 where their position is defined by the flexures.

The flexures will be designed to give sufficient rigidity that the lenses will be properly aligned with the solar cells. The array is not expected to be re-folded, because there will be no access to it.

Accordingly, this invention provides means for the very accurate alignment of Fresnel element arrays relative to arrays of solar cells. The weight of the structure is minimal and the lens curvatures are assured.

It is also possible to provide a hybrid arrangement of parts of the constructions of FIGS. 1–9 and of FIGS. 10–14. In such an arrangement the rigid mounts for the Fresnel lenses of FIG. 10, may be substituted for the flexible mount of FIG. 4, so that the rigid mount is supported by a parallelogram linkage. The lesser compaction of the stack can be accommodated by a suitable spacing between the gores. Thus, the advantages of the rigid mount may be enjoyed along with the advantages of the parallelogram linkage.

This invention is not to be limited by the embodiment shown in the drawings and described in the description which are given by way of example and not of limitation but only in accordance with the scope of the appended claims.

We claim:

1. A stowable and deployable concentrator for solar cells comprising:

a substrate having a substantially planar area;

a row of solar cells mounted to said planar area;

a row of Fresnel lens elements;

deflectable support means supporting said Fresnel lenses above said area when in the deployed condition of the concentrator, and deflecting to enable the support means to be brought toward the substrate in the stowed condition of the concentrator, said support means defining a geometrically defined parallelism of the row of Fresnel lenses with the row of solar cells and with geometrically defined lateral and vertical positioning alignment of them, when in the deployed condition;

said support means comprising a pair of diagonal struts, both mounted to the substrate by respective hinges, and a cross beam mounted to both of said diagonal struts by respective hinges, the spacing between the hinges on the substrate being equal to the spacing between the hinges on the cross beam, whereby to form a parallelogram construction, said row of Fresnel lens elements being supported by said cross beam;

said Fresnel lens elements being flexible, said row of Fresnel lens elements being trough-like; and a frame holding said lenses, said frame comprising a springily flexible shaper having an undistorted curvature respective to the desired curvature of the Fresnel elements, and defining the curvature of said Fresnel lens elements, and a pair of parallel runners attached to said shaper receiving and supporting edges of said Fresnel elements, said shaper being distortable to cause the Fresnel lens elements at least partially to flatten in the stowed configuration.

2. A stowable and deployable concentrator for solar cells comprising:

a substrate having a substantially planar area;

a row of solar cells mounted to said planar area;

a row of Fresnel lens elements;

deflectable support means supporting said Fresnel lenses above said area when in the deployed condition of the concentrator, and deflecting to enable the support means to be brought toward the substrate in the stowed condition of the concentrator, said support means defining a geometrically defined parallelism of the row of Fresnel lenses with the row of solar cells and with geometrically defined lateral and vertical positioning alignment of them, when in the deployed condition;

said support means comprising a frame comprising a pair of spaced apart end frames and a pair of spaced apart rails interconnecting said end frames, and said Fresnel lens elements being flexible and retained in a predetermined shape by said frame, and further including a plurality of stiffly bendable flexures supporting said frame above said substrate, said flexures being bendable around one of their axes, and resistant to bending around an axis normal thereto whereby said frame can be moved toward said substrate by the bowing-out distortion of said flexures, and is restored to a known location when distortive force is released from said frame.

3. A concentrator according to claim 2 in which said flexures are curved in a plane parallel to the substrate.

4. In combination: a pair of concentrators according to claim 2 shaped as wedge-shaped gores, and hinge means hingedly joining adjacent edges of said gores for relative folding and unfolding movement, and spacing the substrates apart from one another when they are parallel, to accommodate the cells and Fresnel lens elements between them in the stowed configuration.

5. A stowable and deployable concentrator for solar cells comprising:

a substrate having a substantially planar area;

a row of solar cells mounted to said planar area;

a row of Fresnel lens elements;

deflectable support means supporting said Fresnel lenses above said area when in the deployed condition of the concentrator, and deflecting to enable the support means to be brought toward the substrate in the stowed condition of the concentrator, said support means defining a geometrically defined parallelism of the row of Fresnel lenses with the row of solar cells and with geometrically defined lateral and vertical positioning alignment of them, when in the deployed condition;

said support means comprising a pair of diagonal struts, both mounted to the substrate by respective hinges, and a cross beam mounted to both of said diagonal struts by respective hinges, the spacing between the hinges on the substrate being equal to the spacing between the hinges on the cross beam, whereby to form a parallelogram construction, said row of Fresnel lens elements being supported by said cross beam;

said support means also comprising a frame comprising a pair of spaced apart end frames and a pair of spaced apart rails interconnecting said end frames, and in which said Fresnel lens elements are flexible and retained in a predetermined shape by said frame, said end frames also comprising said cross beams.

6. In combination: a pair of concentrators according to claim 5 shaped as wedge-shaped gores, and hinge means hingedly joining adjacent edges of said gores for relative folding and unfolding movement, and spacing the substrates apart from one another when they are parallel, to accommodate the cells and Fresnel lens elements between them in the stowed configuration.

7. In combination, a pair of stowable and deployable concentrators for solar cells each comprising:

a substrate having a substantially planar area;

a row of solar cells mounted to said planar area;

a row of Fresnel lens elements; and deflectable support means supporting said Fresnel lenses above said area when in the deployed condition of the concentrator, and deflecting to enable the support means to be brought toward the substrate in the stowed condition of the concentrator, said support means defining a geometrically defined parallelism of the row of Fresnel lenses with the row of solar cells and with geometrically defined lateral and vertical positioning alignment of them, when in the deployed condition, said concentrators being shaped as wedge-shaped gores;

hinge means hingedly joining adjacent edges of said gores for relative folding and unfolding movement, and spacing the substrates apart from one another when they are parallel, to accommodate the cells and Fresnel lens elements between them in the stowed configuration;

said support means comprising a pair of diagonal struts, both mounted to the substrate by respective hinges, and a cross beam mounted to both of said diagonal arms by respective hinges, the spacing between the hinges on the substrate being equal to the spacing between the hinges on the cross beam, whereby to form a parallelogram construction, said row of Fresnel lens elements being supported by said cross beam;

said Fresnel lens elements being flexible and said row of Fresnel lens elements being trough-like; and a frame holding the lenses, said frame comprising a springily flexible shaper having an undistorted curvature respective to the desired curvature of the Fresnel elements, and defining the curvature of said Fresnel lens elements, and a pair of parallel runners attached to said shaper receiving and supporting edges of said Fresnel elements, said shaper being distortable to cause the Fresnel lens elements at least partially to flatten in the stowed configuration.

\* \* \* \* \*